(12) United States Patent
Pietromonaco

(10) Patent No.: US 11,929,129 B2
(45) Date of Patent: Mar. 12, 2024

(54) CONTROL CIRCUITRY AND METHODS FOR CONVERTERS

(71) Applicant: Arm Limited, Cambridge (GB)

(72) Inventor: David Victor Pietromonaco, Cupertino, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/584,711

(22) Filed: Jan. 26, 2022

(65) Prior Publication Data

US 2023/0238072 A1    Jul. 27, 2023

(51) Int. Cl.
| | |
|---|---|
| *H03K 5/00* | (2006.01) |
| *G11C 19/28* | (2006.01) |
| *H03K 5/24* | (2006.01) |
| *H03K 19/20* | (2006.01) |

(52) U.S. Cl.
CPC ............. *G11C 19/28* (2013.01); *H03K 5/24* (2013.01); *H03K 19/20* (2013.01)

(58) Field of Classification Search
CPC .......... G11C 19/28; H03K 5/04; H03K 19/20; H02M 3/1586; H02M 3/1584; H02M 3/3372
See application file for complete search history.

(56) References Cited

U.S. PATENT DOCUMENTS

| | | | | |
|---|---|---|---|---|
| 5,278,489 A | * | 1/1994 | Bowers | H02M 3/1584 363/124 |
| 10,250,234 B2 | | 4/2019 | Pietromonaco | |
| 2003/0231047 A1 | * | 12/2003 | Deaton | H02M 3/1584 327/427 |
| 2005/0001597 A1 | * | 1/2005 | Walters | H02M 3/156 323/222 |
| 2010/0182077 A1 | * | 7/2010 | Hosakawa | H03D 7/1458 327/551 |
| 2011/0011800 A1 | * | 1/2011 | Cord-Ruwisch | C02F 3/302 210/620 |
| 2012/0105040 A1 | * | 5/2012 | Leipold | H02M 3/1584 323/284 |
| 2014/0167711 A1 | * | 6/2014 | Thenus | G05F 1/468 323/234 |
| 2016/0380620 A1 | | 12/2016 | Pietromonaco | |
| 2018/0191333 A1 | * | 7/2018 | Chen | H02M 3/156 |

* cited by examiner

*Primary Examiner* — Tuan T Lam
(74) *Attorney, Agent, or Firm* — Pramudji Law Group PLLC; Ari Pramudji

(57) ABSTRACT

In one implementation, a circuit includes: a comparator; a shift register chain coupled to the comparator; and one or more converters coupled to respective shift registers of the shift register chain, wherein the one or more converters are configured to convert a source of current from a first voltage to a second voltage, and wherein the circuit is configured to selectively transmit an output signal to the one or more converters. In one implementation, the circuit is configured to selectively control modulation for the one or more converters.

20 Claims, 9 Drawing Sheets

|  | Group 1 # of converters | Group 2 # of converters | Group 3 # of converters | Group 4 # of converters |
| --- | --- | --- | --- | --- |
| No weighting | X | X | X | X |
| Exponential | X | 1/2X | 1/4X | 1/8X |
| Root | X | $1/\sqrt{2}X$ | 1/2X | $1/\sqrt{4}X$ |
| Linear | X | 3/4X | 1/2X | 1/4X |
FIG. 7
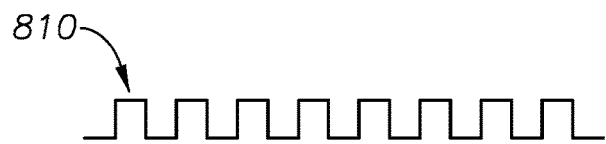
FIG. 8A
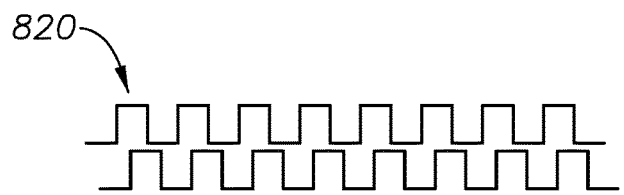
FIG. 8B
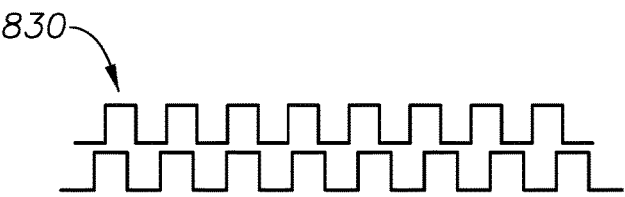
FIG. 8C

CONTROL CIRCUITRY AND METHODS FOR CONVERTERS

I. FIELD

The present disclosure is generally related to circuits and methods for converters.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. Nevertheless, there is an ever increasing need for computing devices to run faster, with better performance, and/or with consuming less power.

Signal generation techniques are used in a number of electronic and electrical applications for many different purposes including telecommunications and power control. In the context of power control systems, signal generation techniques allow control of the electrical power supplied to electrical devices. A popular known signal generation technique for power control systems is Pulse Width Modulation (PWM), which allows a digital control system to generate variable voltage output levels and/or analogue output signals. PWM techniques utilize a generated series of pulses, typically of equal magnitude but variable width, to control the level of power supplied. To generate direct current (DC) output signals, PWM uses pulses of a constant width to generate an output signal at a particular voltage level. To generate alternating current (AC) output signals, pulses of varying width are used instead. To use PWM for relatively high power applications, the switching device which generates the pulse series is required to be rated for the necessary output power levels and as such are relatively large and expensive. Hence, there is a need in the art to provide for digital control systems to operate with greater efficiency, provide greater control flexibility, and are also cost-effective.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

FIG. 7 is a table implementable with example circuits and methods.

FIGS. 8A-8C are diagrams implementable with example circuits and methods.

Figure 1:
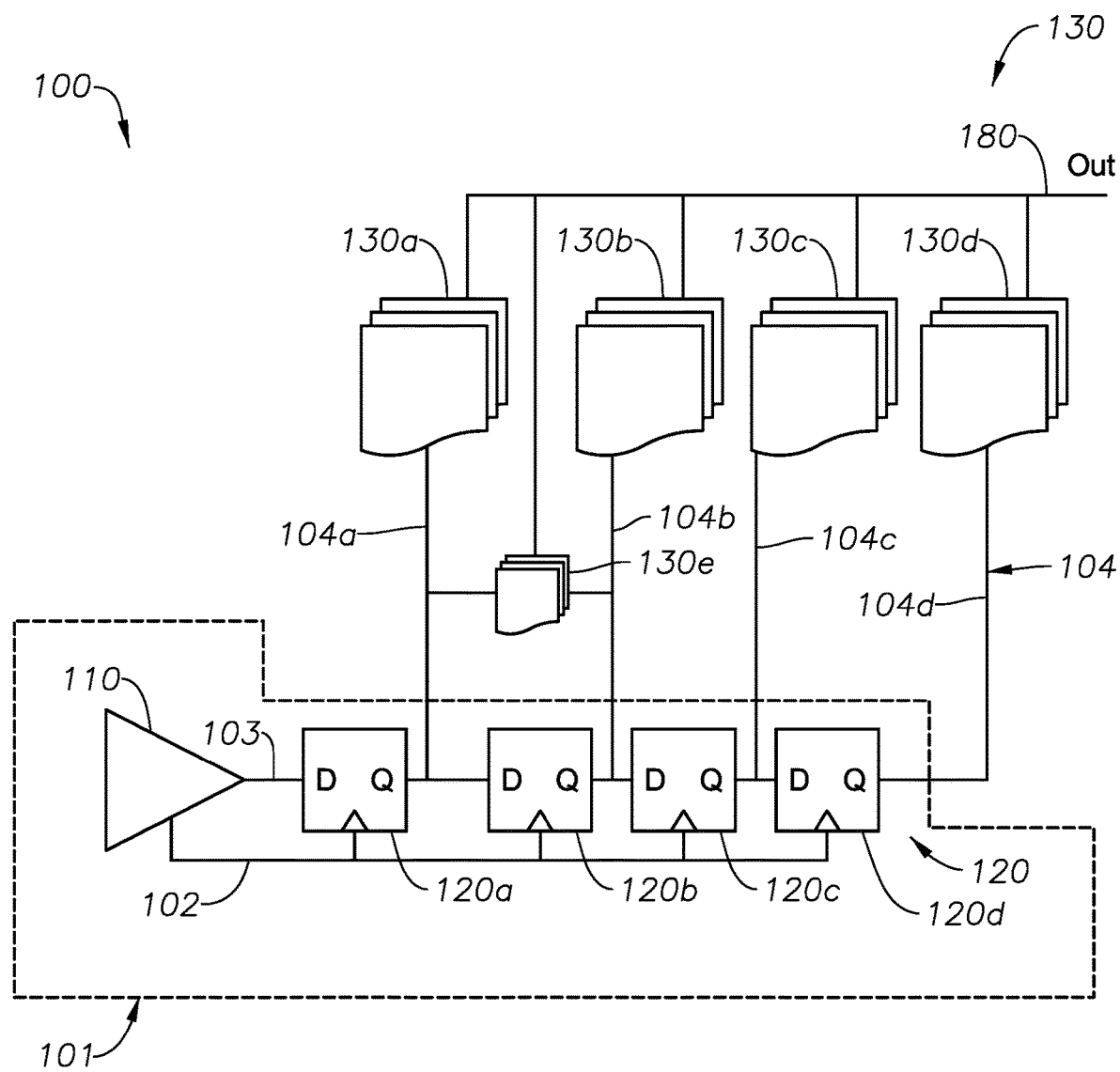
FIG. 1 is a circuit diagram implementable with example circuits and methods.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a circuit includes: a comparator; a shift register chain coupled to the comparator; and one or more converters coupled to respective shift registers of the shift register chain, wherein the one or more converters are configured to convert a source of current from a first voltage to a second voltage, and wherein the circuit is configured to selectively transmit an output signal to the one or more converters.

According to one implementation of the present disclosure, a method including: performing a first comparison, at a comparator, of a voltage sample to a reference voltage sample, wherein: when the voltage sample is above the reference voltage sample, a digital output is transmitted to a first register of a shift register chain; and upon receiving the first digital output of the first comparison, transmitting an output signal to activate a first converter of one or more converters. The one or more converters can be configured to convert a source of current from a first voltage to a second voltage.

According to one implementation, a circuit includes: a comparator; a shift register chain coupled to the comparator; and one or more converters or converter groups coupled to respective shift registers of the shift register chain, wherein the one or more converters are configured to convert a source of current from a first voltage to a second voltage, and wherein the circuit is configured to selectively control modulators for the one or more converters.

Particular implementations of the present disclosure are described below with reference to the drawings. In the description, common features are designated by common reference numbers throughout the drawings.

Advantageously, inventive schemes and techniques provide for a control circuitry configured to implement a novel parallel modulation scheme so as to control modulators for converters. Accordingly, a clock signal may be generated to control activation of one or more converters or converter groups that can be configured to provide modulation for parallel modulation technique for a "total" converter (e.g., an aggregate of converters/converter groups). By doing so, the total converter can be configured to convert a source of current (e.g., DC current) from a first voltage level to a second voltage level (e.g., a step-down of voltage while drawing less average current) from its input to its output (e.g., an electrical load). In one particular implementation, inventive aspects include one sole comparator for control parallel modulation circuitry. Advantageously, an output of the comparator would be transmitted to a shift register chain, where each shift register of the chain can be configured to control the activation of one or more sections of parallel converters (e.g., converters or converter groups). Also, in certain instances, an output of each shift register may be implemented to gate high-speed "conversion clocks" that directly control the parallel converters. In an example, the converter clocks can be configured to control charging and discharging of inductive elements in voltage conversion.

In conventional PWM, control circuitry would operate converters in continuous mode, where the demands for power switching on transistors are much higher because voltage and current would both be present (e.g., as the inductor would not fully discharge). Correspondingly, in PWM, switching devices would be far more expensive. Advantageously, in contrast, the inventive aspects can operate control circuitry in discontinuous mode, and thereby, provide a far more cost-effective solution. Moreover, in some implementations, the very need itself for a computer device would not be required. In such implementations, a comparator and shift register chain can be utilized but the use of any computer device may be eliminated altogether.

In certain instances, the utilization of a single clock to drive all the converters would contribute to various problematic issues. For instance, total harmonic distortion of an entire converter may be greater, which can be further exacerbated with switching noise. Hence, in such a context, it is a need in the art to provide for multiple synchronized clocks. In one implementation, a control system for multiple (i.e., a plurality of comparators) set to different levels (i.e., "tuned a little differently from one another") such that a greater number of comparators that are turned "on", the greater number of parallel modulators may be activated. This would occur due to there being a greater signal deviation between a reference and output, and thus turning on more output modulators. However, inventive aspects further improve upon such an implementation as described herein.

Various implementations of clock construction architecture and schemes and techniques related thereto will be described in greater detail herein with reference to FIGS. 1-10.

Referring to FIG. 1, a diagram of circuitry 100 for parallel modulation circuitry (e.g., switched inductor arrangements) is shown according to example implementations. As illustrated, the circuitry 100 can include a control system 101 including: a comparator 110 and one or more shift registers 120. The control system 101 may be coupled to the one or more converters or one or more converter groups 130 (i.e., sets of parallel modulators, one or more converters) to allow for efficient activation thereof. In one implementation, the comparator 110 may be coupled to the one or more shift registers 120, and each of the one or more shift registers 120 may be coupled by respective output signals 104 (i.e., output clock signals) to the respective one or more converters or converter groups 130 (that comprise one or more converters). Also, the comparator 110 as well as each of the one or more shift registers 120 may receive an input control clock signal 102 as an input. In implementations, the control circuitry 101 may be configured to selectively transmit output signals 104 (104a-104d) of the one or more converters or converter groups 130 to achieve both efficiency and flexibility in control of such converter groups 130.

Figure 2:
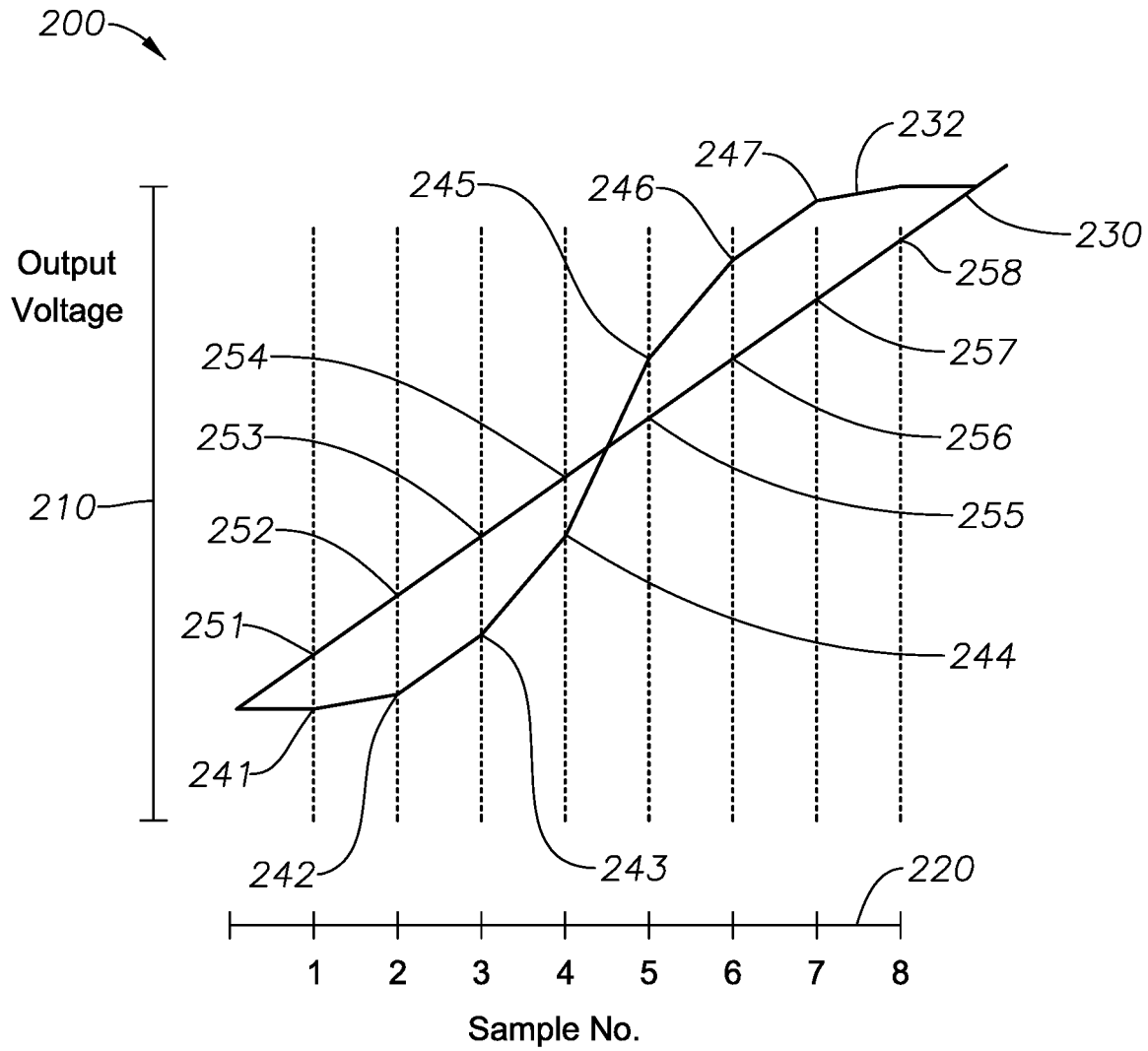
FIG. 2 is a graph implementable with example circuits and methods.

As illustrated, the control circuitry 101 may be used to selectively enable each of the plurality of converter groups 130 (e.g., 130a, 130b, 130c, and 130d) (i.e., switched inductor arrangements). For instance, the control circuitry 101 may comprise a processor or processing system (as described with reference to FIG. 10). Also, the control circuitry 101 may be configured to vary the number of enabled converter groups 130 (e.g., 130a, 130b, 130c, and 130d) and to define a waveform shape of a combined output signal 180. In this manner, apparatus 100 may generate a combined output signal 180 with an arbitrarily shaped waveform, such as sine waves, triangle waves, square waves or sawtooth waves, for example. In certain implementations, a reference signal (e.g., reference signal 232 as shown in FIG. 2) may be tracked to provide the output signal 180. In certain cases, the reference signal may be a steady DC signal. For example, a fixed DC voltage would create a fixed DC output voltage (e.g., a voltage regulator) and a sinusoidal reference signal would create an AC output waveform (e.g., solar power conversion DC to AC).

In one implementation, for example, the comparator 110 (i.e., clocked comparator) may comprise a sense amplifier for a SRAM memory device. Advantageously, the comparator 110 may be a pre-charged comparator (e.g., differential comparator/differential amplifier) as used in such an sense amplifier as just one digital output may be required. For instance, when the output (e.g., a digital "0" or "1") of a comparison is transmitted to a shift register chain (e.g., two or more shift registers 120), each register 120 (e.g., 120a-120d) (of the shift register chain) may be configured to control activation of one of the converters or converter groups 130 (i.e., one section of parallel converters, a set of parallel modulators, two or more converters). Also shown, the comparator 110 may be configured to output an output signal 103 (i.e., voltage signal) (e.g., as described in operation with reference to FIG. 2 as output signal 232).

In certain cases, the shift register(s) 120 may be configured to balance example operations of the system 100 across all the available converter groups 130. Such a balancing would be desirable as heating would be evenly distributed to the converter groups 130, and therefore the converter groups would "wear down" evenly over time. Moreover, in some instances, the shift register(s) 130 can be configured to enable simple digital control of the system through the comparator 100. In some cases, there would a time period required for control information to traverse the length of the shift register(s) 120. For instance, when the speed of transmission is above a certain threshold (i.e., "high") in comparison to a referenced signal to be tracked (e.g., a reference signal 230 as described with reference to FIG. 2), there would be minimal distortion in the output signal 104 (e.g., output signal 232 as described with reference to FIG. 2). Nevertheless, in some instances, it may not be possible to attain a "high enough" shifting speed relative to the reference signal 230. In such cases, the prior information at the end of the shift register(s) 120 may be problematic for a dynamic response. Hence, a distortion in the output signal 104 would be higher in comparison to the reference signal 230 (as described with reference to FIG. 2).

In some cases, by making the shift register (i.e., shift register chain) "shorter" 230 (i.e., with fewer stages/individual registers), the response speed of the control system 100 may be increased. However, by doing so, the number of converter groups 130 that can be used for "turning on and off" would be reduced. For example, utilizing fewer converter groups 130 would make the output signal 104 more coarsely "quantized" with less fine grain control over the increments of change in the output; an outcome that would correspond to having fewer bits to represent a digital value. Such an occurrence would be due to each of the converter groups 130 (e.g., 130a-130d) representing a higher percentage of conversion capability. Moreover, as a result, the distortion in the output signal 104 would be increased. Correspondingly, a shift register chain length can represent the trade-off between a temporal (time-based) distortion in and quantization distortion.

Advantageously, to overcome such a scenario, according to inventive aspects, the number of converters (i.e., converter elements) of the converter groups 130 may be weighted (e.g., as described with reference to FIG. 7). By doing so, a greater quantity of converters may be positioned in the converter groups 130 controlled in the earliest stages of the shift register (e.g., the first shift register of the shift register chain), while positioning fewer converters in the later converter groups 130. Advantageously, the equal distribution of aging and heating across all elements would be retained (as each would be "on" for the same amount of time) but would place the greatest weighting on the most recent information. In various implementations, the weighting could be done in any manner, including, but not limited to: linear, exponential, square law, among others. An example weighting is shown with reference to FIG. 7.

In certain implementations, the output signal 104 (e.g., 104a-104d) may be the output each of the shift registers in the shift register chain 120 (e.g., 120a-120d). In some instances, as shown in FIG. 1, each of the output signal 104 (e.g., 104a-104d) may be implemented directly as a converter clock signal to the converter groups 130. For instance, the clock 104 may control the charging and/or discharging of inductive elements for a particular voltage conversion in the converter groups 130. As may be appreciated, for the voltage conversion, any parallel conversion system could be utilized (e.g., switched capacitor converters).

In one example (as shown with reference to FIG. 1), clock gating would not be required. In such an example, the output signals 104 (e.g., 104a-104d) can become the actual clocks for the converters 130 themselves. Hence, instead of gating the independent converter clocks with the output of the control circuit 101, the control output (i.e., output signals 104) could be the clock for the converter directly. However, such a configuration may not be desirable as the converters would have to clock at the speed of the control clock (e.g., a current issue with conventional modulation systems). Accordingly, as may be appreciated, in certain example implementations (e.g., as described with reference to FIG. 5), a significant advantage would be to run the modulators as fast as possible and that are not hindered by slower control speeds (e.g., the faster the modulators can operate, the smaller the inductors are for the converters 530 (e.g., inductive boost/buck converters).

Specifically, with reference to FIG. 1, the control clock 102 that generates the output signal 104 (e.g., through the comparator 110 and register chain 120) may be slower than the voltage conversion clock (i.e., conversion clock, output signal 104 in the case of FIG. 1). However, in certain examples, it would be desirable that the control clock 102 be on the order of speed of the output conversion rate. Hence, optimally, the conversion clock 104 should also be on the order of "speed" of the output conversion rate. Advantageously, in one implementation, the conversion clock may be set on the order of speed required to make the inductors utilized to be as small and inexpensive as possible. Accordingly, the two clock speeds: the control clock 502 (e.g., as described with reference to FIG. 5) and the conversion clock (e.g., conversion clock 506 in FIG. 5), may be configured to be independent and unrelated to one another. In such an implementation, as described with reference to FIG. 5 (in below paragraphs), a gating clock 504 (e.g., 504a-504d) may be implemented to "gate" the (high speed) conversion clocks 506 (506a-506d). In such an example, the conversion clock signal 506 (506a-506d) may control the charging and/or discharging of inductive elements (in the one or more converter groups 530) for a particular voltage conversion.

Advantageously, the use of a plurality of converter groups 130 (i.e., switched inductor arrangements) would reduce the requirements on each individual converter group 130. For example, the maximum current rating required for each converter group may be reduced, as the supplied current of the combined output signal can be provided by the plurality of converter groups 130 in combination. Furthermore, power dissipation may be improved, as the dissipated power is spread across the various converter groups 130, therefore lowering device temperatures and enabling the use of lower cost cooling solutions. Manufacturing requirements may also/alternatively be improved as the use of surface mount devices may be enabled which are more cost effective in production compared to high current devices which may require hand connected wiring. Furthermore, by varying the number of enabled converter groups 130 to define the waveform shape of the combined output signal, various power dissipation efficiencies and device cost improvements may also be achieved. Hence, control of a an essentially limitless number of converters may be achieved with a finite amount of control circuitry. Moreover, according to inventive aspects, the utilizing of the inventive circuitry 100, 500 can allow for even greater efficiency and cost savings.

In certain cases, the one or more converters or the one or more converter groups 130 (i.e., switched inductor arrangements) may include four converter groups 130 (e.g., further embodiments may comprise more or fewer converter groups 130). In different circuit arrangements, the one or more converter groups 130 may comprise converters including, but not limited to: a buck converter, a boost converter, or a buck-boost converter (e.g., any kind of switching converter, switch capacitor, or switch inductor converter). The converter groups 130 (130a-130d) may be arranged in parallel to generate a combined output signal, OUT 180. In embodiments, the outputs of each of the converter groups 130a-130d are connected together at an output terminal 180. In such embodiments, the outputs of each of the converter groups 130a-130d may be summed together to generate the combined output signal 180. The number of enabled converter groups, therefore, can influence the voltage of the combined output signal 180. During operation of apparatus 100, the combined output signal 180 may be supplied to an electrical device, depicted in FIG. 1 as an electrical load.

In one particular implementation, as shown in FIG. 1, one or more of the converter groups 130 (e.g., as shown with reference to converter group 130e) may be coupled to two or more of the shift registers 120. By doing so, as an example, the converter group 130e may be controlled by the control circuit 100 through respective output signals 104a and 104b. As may be appreciated, as an advantage, the clocks for the individual converters may be designed to operate as fast as possible so as to reduce the size necessary of the inductors in the converter groups 130.

Referring to FIG. 2, a graph 200 is shown illustrating an example operation of the system 100. As illustrated, the chart 200 depicts the output voltage of an output signal 230 and a reference signal 232 as plotted based on various sample comparisons (e.g., respective output voltages of samples 1 to 6 corresponding to respective shift registers 1-6). For instance, the output voltage is shown on the Y-axis 210, while each of the example samples are shown on the X-axis 220. Advantageously, the technique may be operable with either low or high voltage devices. In implementations, the range of the output signal 230 and reference signal 232 would be limited by the type of MOSFET (or other type of transistor) utilized. Hence, the range may vary from millivolts (mv) to hundreds of volts (v).

With reference to FIGS. 1 and 2, the following paragraphs describe one operation of an example four converter group system 100 (e.g., including converter groups 130a-130d as illustrated in FIG. 1). In the example operation, for a first sample (i.e., sample 1, during a first time period, a first comparison of the comparator 110), when a first output voltage 241 (i.e., corresponding to an output voltage of the first sample) that is regulated by the system 100 is below a certain reference threshold (i.e., the output voltage being "too low"—as to being below a first reference voltage 251 of a reference signal 232 (i.e., a reference voltage sample), the comparison between the first output voltage 242 and the first reference voltage 251 would transmit a digital "1" into a first shift register 120a (i.e., the lead shift register of a shift register chain 120) to activate a first converter group 131a (i.e., a first set of parallel modulators). Specifically, as the first shift register 120a is turned "on", a gating clock signal 104 may be transmitted to the first converter group 130a. In doing so, the first converter group 130a may be enabled, and the output signal 230 would increase (i.e., the output signal would "rise" as illustrated in FIG. 2).

Next, in a second time period, a second sample may be obtained through a comparison between a second output voltage 242 (i.e., an output voltage of the second sample) and the second reference voltage 252. As depicted in the example of FIG. 2, the output signal 232 may again be below a provided threshold (e.g., the output voltage being again "too low"; to below a first reference voltage 251 of the reference signal 232), a second digital "1" would be transmitted (i.e., another digital "1" would "shift down") to the shift register chain 120. In doing so, the second digital "1" is transmitted to the first shift register 120a (i.e., a first stage of the shift register chain) while the first digital "1" would be "shifted" to a second shift register 120b. Accordingly, at this juncture, both the first and second converter groups 130a, 130b (e.g., banks of modulators) may be activated (i.e., turned "on"), and thus, the output signal 232 would "rise" faster (e.g., there would be a doubling of the voltage signal to a "boost" amount). As may be appreciated, the slope of the output signal 232 would depend on how many converters are present in each group as well as the voltages and currents such converters have been designed to handle. In one implementation, as one example, if a first converter group was outputting 10 mA and a second converter group was turned on, then 20 mA could be output.

At a third period, for a third sample, similar to the first and second samples, upon a comparison of a third output voltage 243 (i.e., an output voltage of the third sample) being less than a third reference voltage 253, a third digital "1" may be transmitted (i.e., "pushed") into the register train 120, and thus, turning "on" the first three shift registers 120a-120c. At this interval, while the output signal 232 is rising faster than the prior two intervals and now at approximately at a similar rate as that of the reference signal 230, because the voltage of the output signal 232 is still below the voltage level of the reference signal 230 at this juncture, a third converter group 130c may be activated.

At a fourth period, for a fourth sample, upon a comparison of a fourth output voltage 244 (i.e., an output voltage of the fourth sample) being less than a fourth reference voltage 254, a fourth digital "1" may be transmitted (i.e., "pushed") into the register train 120, and thus, turning "on" all four corresponding shift registers 120a-120d. At this interval, the output signal 232 is rising faster than the prior three intervals as well as that of the reference signal 230. However, again, because the voltage of the output signal 232 is still below that of the reference signal 230 at this juncture, a fourth converter group 130d may be activated as well.

Next, at a fifth period, for a fifth sample and in contrast to the prior four samples, upon a comparison of a fifth output voltage 245 (i.e., an output voltage of the fifth sample) being greater than a fifth reference voltage 255, now, the converter 110 would transmit a digital "0" (i.e., "pushed") into the first shift register 120a of the register train 120. Correspondingly, each of the digital "1" outputs would shift over to the second, third, and fourth registers 120b-120d. Hence, at this juncture, the first register 120a would be turned "off", while the second, third, and fourth registers 120b-120d would be turned "on". Hence, the first converter group 130a would be de-activated, while the second, third, and fourth converter groups 130b-130d would remain active. As illustrated in FIG. 2, at the fifth period, this scenario would occur as the voltage of the output signal 232 is now greater than that of the reference signal 230.

At the sixth period, for a sixth sample, and similar to the fifth sample, as the comparison of a sixth output voltage 246 (i.e., an output voltage of the sixth sample) is greater than a sixth reference voltage 256, the converter 110, again, would transmit a digital "0" (i.e., "pushed") into the first shift register 120a of the register train 120. In doing so, at this juncture, now, just two shift registers 120c, 120d would include a digital "1" and be turned "on". Correspondingly, just the third and fourth converter groups 130c, 130d would be activate, while the first and second converter groups 130a, 130b are deactivated.

Similarly, in the seventh and eighth periods (as illustrated in FIG. 2), for the respective seventh and eighth samples, the comparisons of a seventh output voltage 247 (i.e., an output voltage of the seventh sample) being greater than seventh reference voltage 257, and the eighth output voltage 248 (i.e., an output voltage of the eighth sample) being greater than a eighth reference voltage 258, the converter 110, again, would transmit digital "0's" (i.e., "pushed") into the first shift register 120a of the register train 120. In doing so, after the seventh period, one shift register 120d, would include a digital "1" and be turned "on", and just the fourth converter group 130d would be active. Also, in the same manner, after the eighth period, no registers 120 would be turned "on", and none of the converter groups would be active.

Figure 3A:
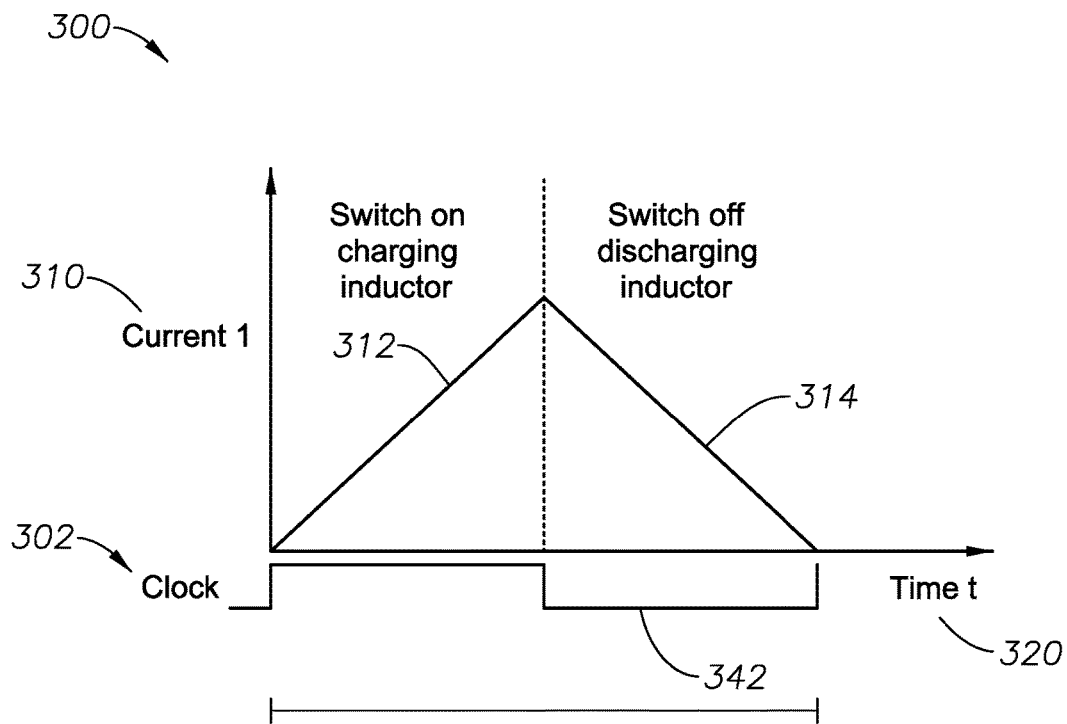
FIGS. 3A-3B are graphs implementable with example circuits and methods.
Figure 3B:
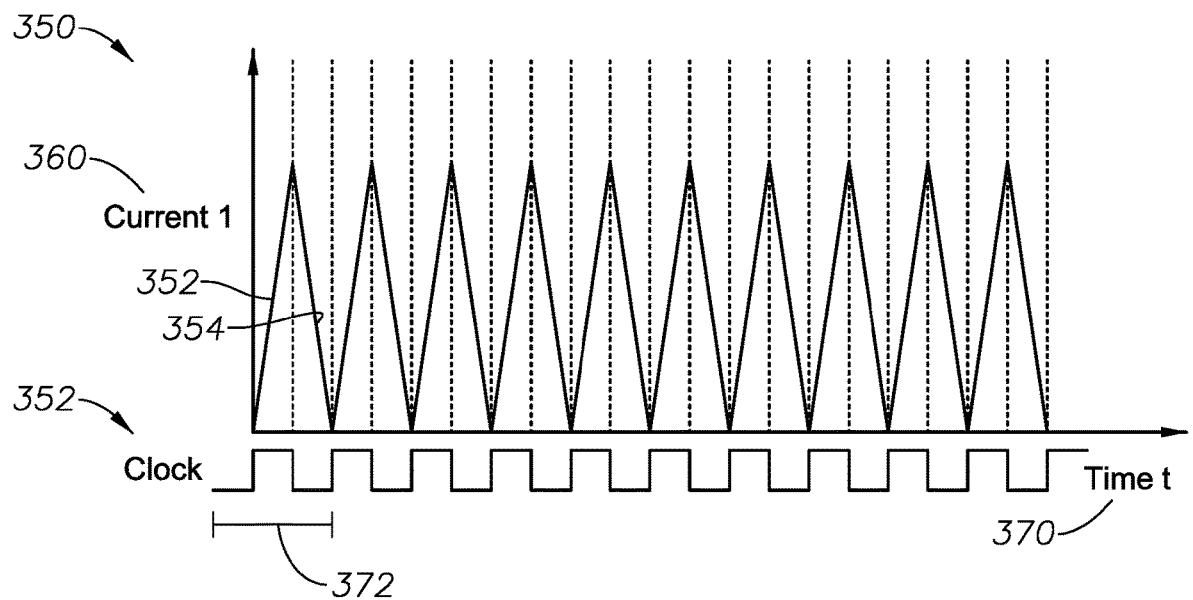

Referring to FIGS. 3A-3B, clock timing graphs 300, 350 are shown according to example implementations. As illustrated, FIGS. 3A-3B represent example clock timing graphs for the converter groups 130 (e.g., 130a-130d) in FIG. 1. As one advantage, unlike traditional modulation schemes, according to inventive aspects, the clocking mechanism for each of the individual converter groups (e.g., gating clock 104 in FIG. 1, may be unrelated to the clocking mechanism for the control circuitry (e.g., control clock 102 in FIG. 1).

For instance, with reference to FIGS. 3A-3B, clocks 302, 352 for the individual converter groups can be configured to operate as quickly as possible. In doing so, the size of the inductors utilized may be reduced. As illustrated in FIGS. 3A-3B, current (I) of a charging inductor is shown on a y-axis (e.g., 310, 360) in comparison over a time duration (t) on an x-axis (e.g., 320, 370). In one example, the inductor/inductors may be "timed" (e.g., a timing utilized to ensure that that a discharge time is large enough such that an inductor in an converter/converter group is discharged) such that an individual converter can fully charge a switching inductor when "on", and fully discharge the switching inductor while "off." As may be appreciated, it would be desired to discharge then inductor for the approximately the same amount of time or slightly more than the time that the inductor may be charged. In doing so, discontinuous mode operation where the inductor fully discharges would occur. This outcome would be desirable as the devices utilized would not have to switch much power. Hence, there would either be no current and an amount of voltage to switch, or no voltage and an amount of current to switch. Accordingly, in either circumstance, current (I) multiplied by voltage (V) would be approximately equivalent to "0". As such, because the control circuitry would shorten the charging half of the clock, the discharge would be correspondingly "longer" than the charge portion and discontinuous mode operation would be continued to be observed. Conversely, conventional PWM control must operate the converters in continuous mode, where the demands for power switching on the transistors are much higher because voltage and current would both be present (e.g., as the inductor never fully discharges). Accordingly, switching devices would correspondingly be far more expensive. Advantageously, in comparison, the inventive aspects as described herein provide a far more cost-effective solution.

To provide for such an outcome, a roughly symmetric clock signal (e.g., approximately 50% "on" duration, 50% "off" duration) or slightly more time "off" than "on" may be utilized. As illustrated, in FIG. 3A, for an example large inductor (e.g., millifarad (mF) inductor), the segment 312 on the graph 300 represents the "on" portion (i.e., the switching "on" charging inductor) and the segment 314 on the graph 300 represents the "off" portion (i.e., the switching "off" discharging inductor). Similarly, in FIG. 3B, for an example small inductor (e.g., microfarad (µF) inductor), the segment 352 on the graph 350 represents the "on" portion (i.e., the switching "on" charging inductor) and the segment 354 on the graph 350 represents the "off" portion (i.e., the switching "off" discharging inductor).

As may be appreciated, Faraday's law for an inductor states that an instantaneous voltage across an inductor (v) equals inductance (L) (in Henrys) multiplied by an instantaneous rate of current change (in amps per second). As such, in an example implementation, it may be desired to convert 110 v (DC) to 10 v (DC) through an example converter (e.g., a buck converter) utilizing an example inductor. In doing so, the inductor would receive a voltage drop of approximately 100 v. Accordingly, for a millifarad (mF) inductor (e.g., a "large" inductor as depicted in FIG. 3A), it would take approximately 1 microsecond (ms) to reach 0.1 amps (A) after switching "on". In contrast, for a microfarad (µF) inductor (e.g., a "small" inductor as depicted in FIG. 3B), it would take approximately 1 nanosecond (ns) to reach 0.1 amps (A) after switching "on". For instance, as shown in FIG. 3A, for a large inductor (e.g., a millifarad (mF) inductor), a first clock period 342 would be a significantly larger time period (e.g., 10× the time duration) in comparison to a second clock period 372 (as shown in FIG. 3B).

Figure 4:
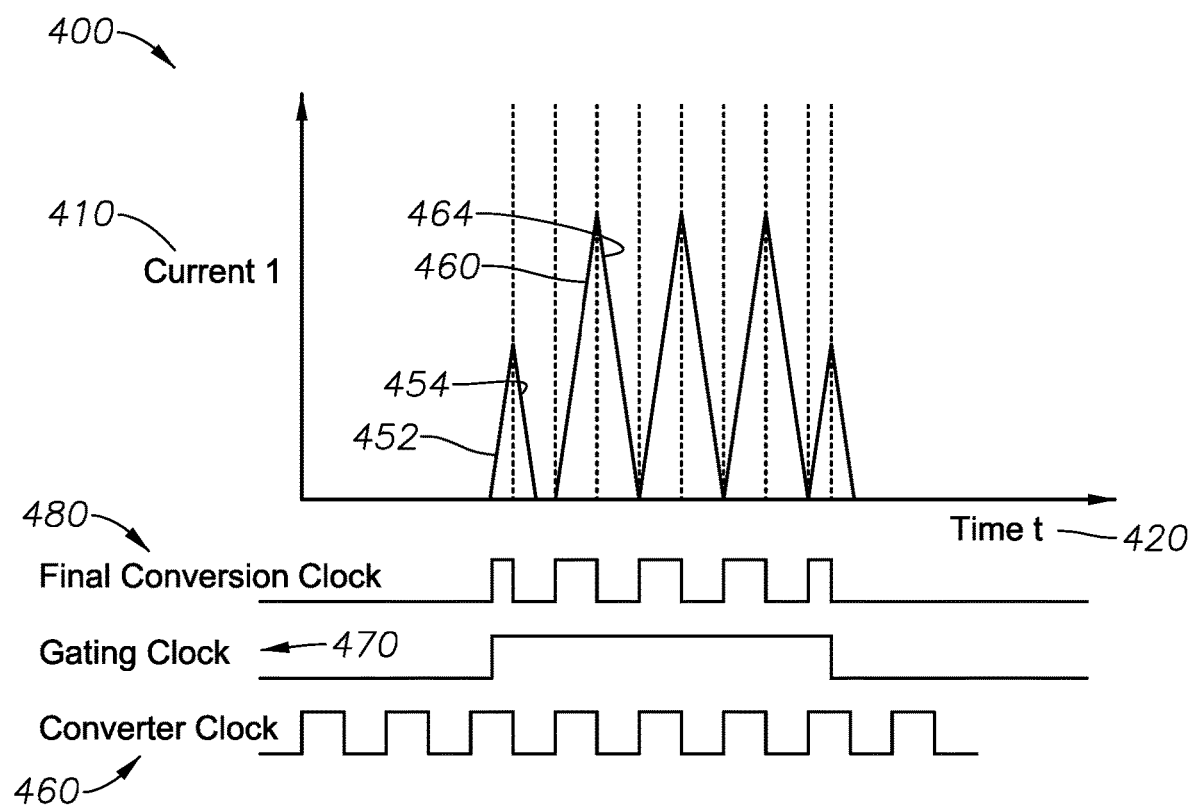
FIG. 4 is a graph implementable with example circuits and methods.

Referring to FIG. 4, a clock timing graph 400 is shown according to an example implementation. As illustrated, FIG. 4 represents another example clock timing graph for the converter groups 130 (e.g., 130a-130d) in FIG. 1. Similar to the examples of FIGS. 3A-3B, on the y-axis, current (I) of a charging inductor is shown on a y-axis (e.g., 410) in comparison over a time duration (t) on an x-axis (e.g., 420). Likewise, the inductor(s) utilized may again be "timed" such that an individual converter can fully charge a switching inductor when "on", and fully discharge the switching inductor while "off."

As shown in FIG. 4, the segment 452 represents the "on" portion (i.e., the switching "on" charging inductor) of a "smaller" inductor, while the segment 454 represents the "off" portion (i.e., the switching "off" discharging inductor) for the same "shorter" inductor (e.g., the shorter pulse would charge an inductor less, but would not break the discontinuous mode paradigm. Hence, the devices would not have switch burdensome power and overheat. Hence, the occurrence of short pulses would not be an issue in overall operation). Also, the segment 462 represents the "on" portion (i.e., the switching "on" charging inductor) of a "larger" inductor, while the segment 464 represents the "off" portion (i.e., the switching "off" discharging inductor) for the same "larger" inductor. As described, each of the segments included represent clock artifacts of gating. Advantageously, the "on" and "off" segments (i.e., clock artifacts) on the clock timing graph 400 would correspond to an example final conversion clock signal 480. Also shown in comparison is an example clock signal of the gating clock 470 (e.g., 104a-104d in FIG. 1, 504a-504d in FIG. 5) and a clock signal of an initial converter clock 460 (e.g., 506a-506d in FIG. 5) as described with reference to FIG. 5).

As may be appreciated, in certain inventive aspects, the "gating" of the clocks of the converter groups 130, 530 with logic (i.e., any digital "gating" of signals) (e.g., AND/NAND logic, OR/NOR logic, or a multiplexer) would allow the for control of such converter groups 130, 530 (e.g., with reference to FIG. 5 in below paragraphs). In certain examples, while some of the clock periods may be determined to be "short" (e.g., a converter clock where the pulse may be shortened because of gating with the control output signal gate clock), as long as the "on" period is provided to be shorter than the "off" period (e.g., another AND-type function, a result of gating the converter clock with the control clock), control of the converter groups may be achieved. Also, in certain cases, as the inductor(s) utilized would be required to be fully discharged, the "on" period would be equal to or less than the "off" period. Accordingly, as well, a 50-50 duty cycle may be implemented in operation.

Figure 5:
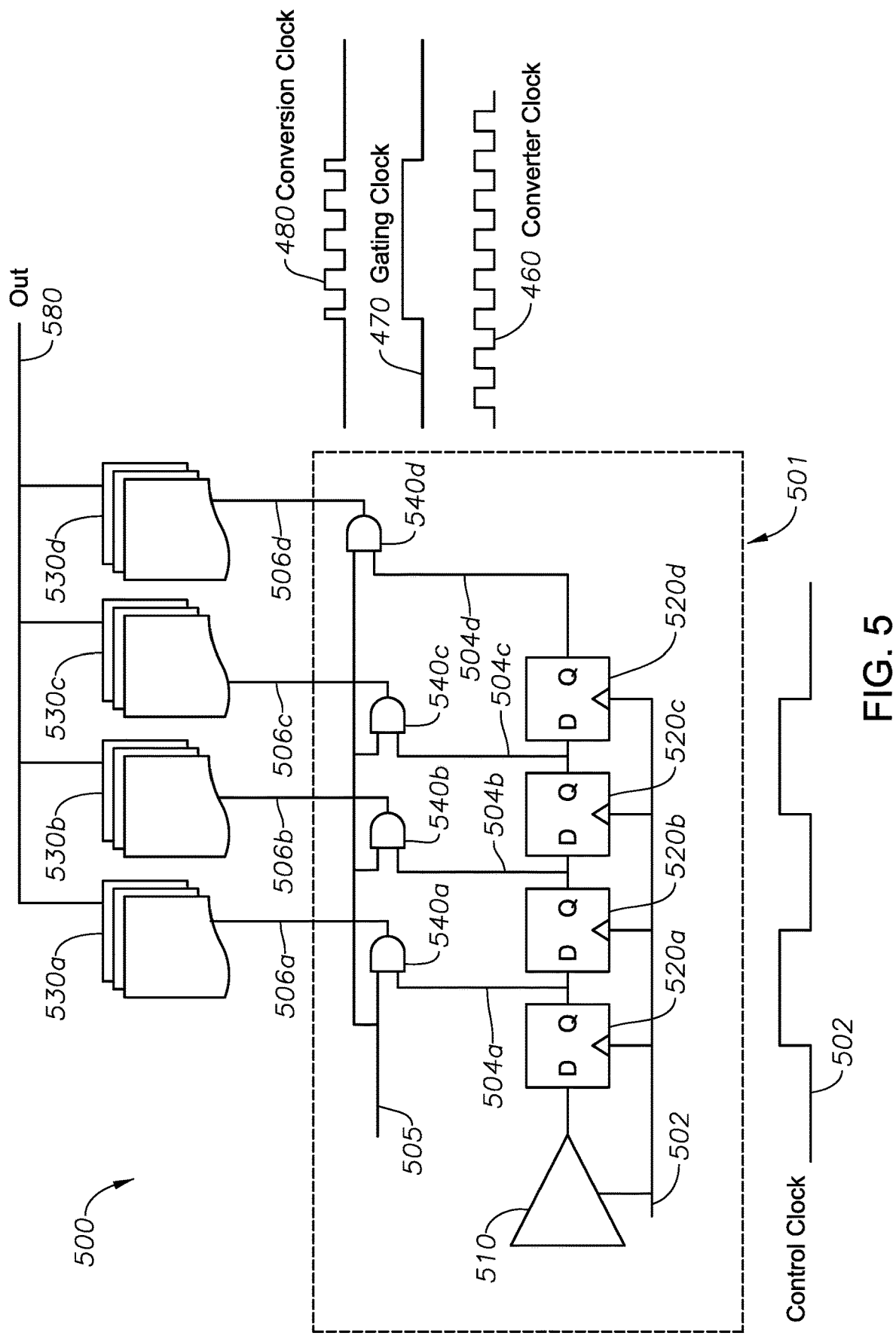
FIG. 5 is a circuit diagram implementable with example circuits and methods.

As an advantage, in inventive aspects, because the "short" clocks would not pose an issue in operation, the control clock (i.e., 102, 502 in FIG. 5) may be fully independent of the converter clock (i.e., 505 in FIG. 5, corresponding to 460 in FIG. 4). With reference to FIG. 4, as illustrated, for the free running converter clock 460, all the pulses are the correct length to make the inductor fully charge and fully discharge. However, if clock 460 were to be gated with the asynchronous 470 "gating" clock, "short" output pulses would likely result. Nevertheless, such an occurrence would not hinder the operation, as it would only make some of the charging cycles short while the discharge cycle would still be long enough to discharge the inductors and preserve discontinuous mode operation.

Referring to FIG. 5, a diagram of circuitry 500 for parallel modulation circuitry (e.g., switched inductor arrangements) is shown according to example implementations. As illustrated, the circuitry 500 can include a control circuit 501 including: a comparator 510 and one or more shift registers 520. The control system 501 may be coupled to the one or more converters or one or more converter groups 530 (e.g., 530a-530d) (i.e., sets of parallel modulators, two or more converters). In one implementation, as shown, the comparator 510 may be coupled to the one or more shift registers 520, and each of the one or more shift registers 520 (e.g., 520a-520d) may be coupled by respective gating clocks 504 (e.g., 504a-504d) (i.e., input gating clock signal) to a first input of a respective AND gate 540 (540a-540d). Also, each of the AND gates 540 (540a-540d) would receive a second input from a converter clock 505, and would each output respective gating clocks 506 (506a-506d) to respective one or more converters or converter groups 530 (e.g., 530a-530d) (that comprise two or more converters). Also, the comparator 510 as well as each of the one or more shift registers 520 may receive an input control clock signal 502 as an input. In implementations, the control circuitry 500 may be configured to selectively transmit conversion signals 506 (506a-506d) (e.g., conversion clock signals) of the one or more converters or converter groups 530 to achieve both efficiency and flexibility in control of such converter groups 530.

When driving all of the converters from a same clock, the circuit may experience significant harmonic distortion for an entire converter (all of the converters/converter groups in aggregate) as well as switching noise. To overcome such an issue, advantageously, the circuit 500 allows for the capacity to provide for multiple clocks (e.g., multiple synchronized or asynchronous converter clocks).

In certain implementations, similar to corresponding components in FIG. 1, each of the circuit components: clocked comparator 510, shift registers 520, and converter groups 530 in FIG. 5 may be substantially similar in design and operation. In contrast to FIG. 1, the implementation of FIG. 5 also includes respective AND gates 540 (e.g., 540a-540d) and conversion clocks (e.g., 506a-506d). In an example implementation, a particular AND gate is configured to allow for the converter clock 505 to be combined (i.e., "ANDed") with a gating clock 504 (e.g., 504a-504d). Advantageously, with the inclusion of the AND gates 504, the control system 500 has the capacity to have multiple (e.g., and different in some instances) conversion clocks 506 (e.g., 506a-506d). Moreover, in such implementations, advantageously, the integration of the converter clock 505 can be fully separate from that of the control clock 502.

Moreover, the control clock 102 that generates the gating clock 104 (e.g., through the comparator 110 and register chain 120) may be slower than the voltage conversion clock (i.e., conversion clock). As an example, the control clock should be on the order of speed of the output conversion rate). Hence, optimally, the conversion clock should be on the order of "speed" of the output conversion rate. In one implementation, advantageously, the conversion clock may be set on the order of speed required to make the inductors utilized to be as small and inexpensive as possible. Accordingly, the two clock speeds: the control clock 502 (e.g., as described with reference to FIG. 5) and the conversion clock (e.g., 506 in FIG. 5), may be configured to be independent and unrelated to one another.

As shown in FIG. 5, a gating clock 504 (e.g., 504a-504d) may be implemented to "gate" the (high speed) conversion clocks 506 (506a-506d). In such an example, the conversion clock signal 506 (506a-506d) may control the charging and/or discharging of inductive elements (in each of the converters) for a particular voltage conversion. In an example, as it would be desired that the control clock 502 would be considerably faster than a signal to be tracked (a user-provided reference signal) by a particular conversion. As may be appreciated, an exact minimum speed of the tracked signal would depend on several factors including, but not limited to: 1) a slew rate of the signal to be tracked; and 2) a collective conversion power of the converter groups. Also, in operation, it would be desirable that the converter clocking 505 is faster than the control clocking 502.

In an example operation, the circuit 500 may follow a similar circuit operation as described with reference to FIG. 2, with the inclusion of the combination of the converter clock 505 and the gating clocks 504 (e.g., 504a-504d) (output from respective shift registers (520a-520d)) to generate a conversion clocks 506 (e.g., 506a-506d). Advantageously, through such an operation, specific, flexible, and optimized control of the conversion groups 530 (e.g., 530a-530d) may be achieved.

Moreover, as illustrated, the control circuitry 501 may be used to selectively enable each of the plurality of converter groups 530 (e.g., 530a, 530b, 530c, and 530d) (i.e., switched inductor arrangements). For instance, in certain instances, the control circuitry 501 may comprise a processor or processing system (as described with reference to FIG. 10). Also, the control circuitry 101 may be configured to vary the number of enabled converter groups 530 (e.g., 530a, 530b, 530c, and 530d) and to define a waveform shape of a combined output signal 580. In this manner, apparatus 500 may generate a combined output signal 580 with an arbitrarily shaped waveform, such as sine waves, triangle waves, square waves or sawtooth waves, for example. In certain implementations, a reference signal (e.g., reference signal 232 as shown in FIG. 2) may be tracked to provide the output signal 580. In certain cases, the reference signal may be a steady DC signal. For example, a fixed DC voltage would create a fixed DC output voltage (e.g., a voltage regulator) and a sinusoidal reference signal would create an AC output waveform (e.g., solar power conversion DC to AC).

Figure 6:
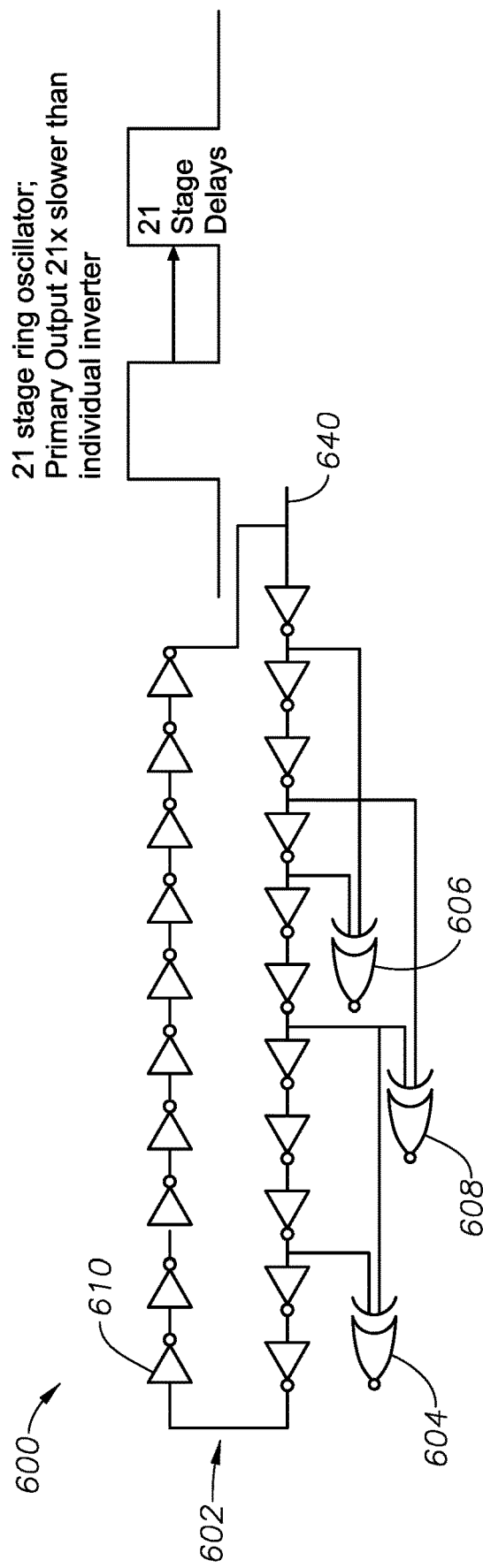
FIG. 6 is a diagram implementable with example circuits and methods.

Referring to FIG. 6, a diagram of clock generation circuitry 600 for the control circuitry (e.g., 100, 500) (i.e., a control system) for parallel switch modulator circuitry (PWM) is shown according to example implementations. In certain implementations, when the clock generation may be configured to be locally generated on-chip, the circuitry 600 may be implemented. For example, such circuitry 600 can provide clock sources for one or both the control clock 102, 502 and the converter clock 505. As illustrated, the circuitry 600 may include an inverter ring oscillator 602 (i.e., ring oscillator) and first, second, and third XNOR gates (i.e., taps) 604, 606, 608.

The ring oscillator 602 may include a plurality of inverters 610 (e.g., 21 NOT-gates) arranged in a chain ring where a last inverter is fed back to a first inverter. In one example, the ring oscillator 602 may be a 21-stage ring oscillator where the primary output clock 640 can be configured to be 21 times slower than an individual inverter.

The first, second, and third XNOR gates (i.e., taps) 604, 606, 608 correspond to an initial tap 604, an overlap tap 606, and a subsequent tap 608. In some cases, XNOR gates (or XOR gates alternatively) may be implemented to change a duty cycle of the output clock 640. For instance, by including three separate stages (e.g., an initial tap 604, an overlap tap 606, and a subsequent tap 608), a 1:7 clock skew may be achieved. In some instances, the duty cycle may be tuned according to the requirements of the converter groups. Moreover, in another implementation (not shown), seven XNOR gates may be coupled via OR gates and can be "tapped" (e.g., to utilize one of the intermediate signals from the ring oscillator as the signal generated by the operation of the entire ring) together at subsequent groups of 3 to provide a faster output clock signal. In addition, in an alternative implementation, the taps 604, 606, and 608 may be arranged to overlap one another. In doing so, skewed clocks may be provided to the converter groups.

For example, a single output of a ring oscillator would be a clock type of pulse, where the width of each half (the "on" half and the "off" half) is the propagation delay for a pulse edge to traverse the entire ring. Accordingly, if 21 devices are utilized, the resulting clock output would be a speed 21 times slower than the speed at which a single device can be switched. As it would be desired that our conversion clocks to be near the maximum speed of the devices, the clock output would be too slow. Hence, utilizing a XOR gate separated by just a few devices in the ring, a very fast pulse may be generated each time an edge circles the ring (e.g., the XOR will basically just detect that edge). The resulting pulse, however, would still be periodic at the same rate as the entire ring. Thus, a short "on" pulse and a longer "off" time would be generated. In FIG. 6, three device delays worth of "on" time and 18 device delays worth of "off" time is shown. Hence, in order to make a symmetric clock, it would be desired to combine seven of the three device delay pulses with three device delays in-between them.

In another implementation (not shown), instead of the circuit 600, an externally provided clock source, for example, a quartz crystal oscillator reference (i.e., crystal oscillator), may be utilized for clock generation. For instance, the crystal oscillator may be an electronic oscillator circuit that implements the mechanical resonance of a vibrating crystal of piezoelectric material to create an electrical signal with a constant frequency.

In some arrangements, the control clock and the converter clock may each be selectively connectable to a plurality of clock signals, each of which have different frequency or duty cycle characteristics. In embodiments, the control circuitry may select which of the various possible clock signals to connect to a given converter group, and therefore which clock signal is used to generate the particular input signal for a particular converter or converter group. By using such a technique, a finer degree of control over the total rate and/or duration of pulses which contribute to a combined output signal can be exercised by the control circuitry, without requiring control circuitry to operate as fast as the frequency of the generated switch signals.

Referring to FIG. 7, a table is shown according to an example implementation. As illustrated in FIG. 7, example ratios of example time-weighted converter groups is shown. In an example, a greater quantity of converters may be positioned in the converter groups controlled in the earliest stages of the shift register (e.g., the first shift register of the shift register chain), while positioning fewer converters in the later converter groups 130. Advantageously, the equal distribution of aging and heating across all elements would be retained (e.g., as each would be "on" for the same amount of time) but would place the greatest weighting on the most recent information. In various implementations, the weighting could be done in any manner, including, but not limited to: linear, exponential, square law, among others.

Referring to FIGS. 8A-8C, diagrams according to example implementations are shown. As illustrated, in FIG. 8A, a single converter clock 810 is shown. In FIG. 8B, multiple synchronized converter clocks 820 are shown. In FIG. 8C, multiple asynchronous ("random"); i.e., out of phase with respect to one another and/or of different frequencies) converter clocks 830 are shown.

In example operations, with reference to FIGS. 1-5, the control clock 102 that generates the gating clock 104 (e.g., through the comparator 110 and register chain 120) may be slower than the voltage conversion clock (i.e., conversion clock) of the converter groups. As an example, the control clock may be configured to be on the order of speed of the output conversion rate). Hence, optimally, the conversion clock (e.g., one a single converter clock 810, multiple synchronized converter clocks 820 are shown, or multiple random converter clocks 830) should be on the order of "speed" of the output conversion rate. In one implementation, advantageously, the conversion clock may be set on the order of speed required to make the inductors utilized to be as small and inexpensive as possible.

Figure 9:
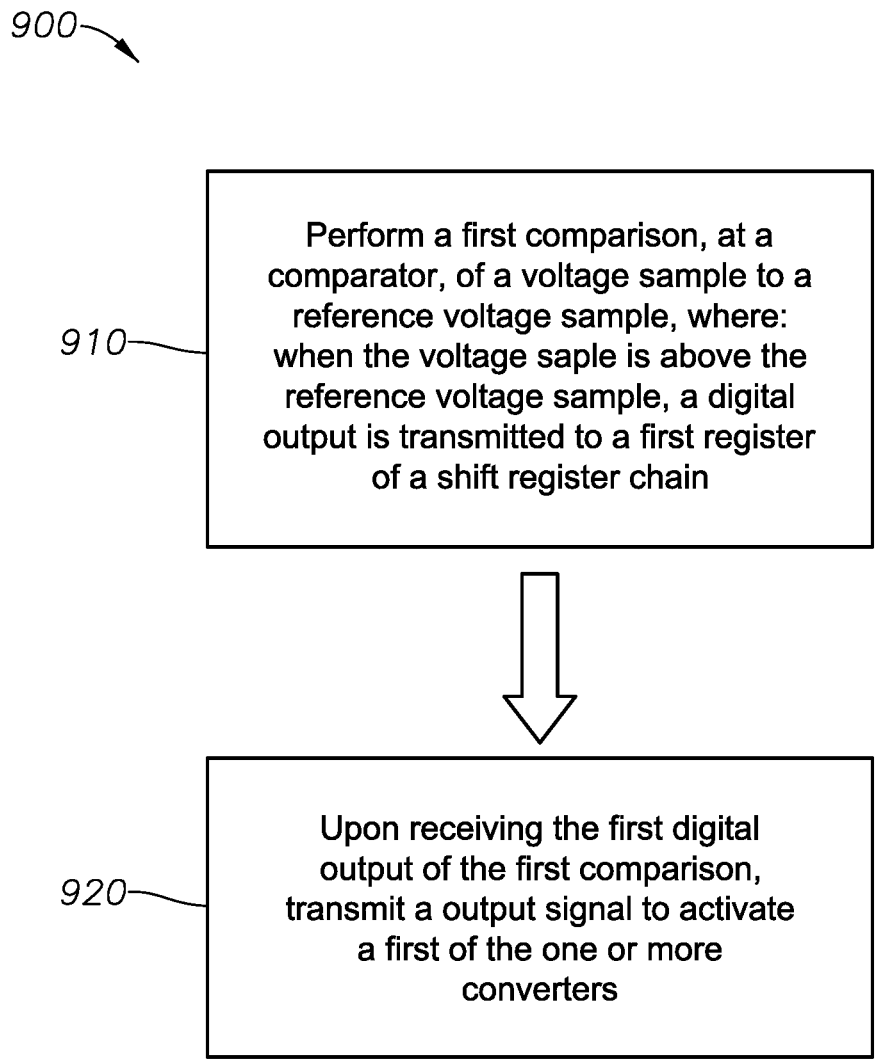
FIG. 9 is a flowchart of a particular illustrative aspect of example methods.

Referring to FIG. 9, a flowchart of an example method 900 (i.e., procedure) to generate a clock signal for activation of one or more converters or converter groups that provides modulation for a parallel modulation technique for a total converter (e.g., an aggregate of converters/converter groupings) is shown. Advantageously, in various implementations, the method 900 depicts independent utilization of a control clock and a converter clock. The method 900 may be implemented with reference to circuit implementations and operations as depicted in FIGS. 1-8 and 10 and/or combinations thereof.

At block 910, the method includes performing a first comparison, at a comparator, of a voltage sample to a reference voltage sample. For example, when the voltage sample is above the reference voltage sample, a digital output (e.g., "1") may be transmitted to a first register of a shift register chain. With reference to various implementations as described in FIGS. 1-8 and 10, a first comparison, at a comparator (e.g., 110, 510), of a voltage sample (e.g., of an output signal at a sample instance) to a reference voltage sample e.g., of an reference signal at the sample instance).

At block 920, the method includes upon receiving the first digital output of the first comparison, transmitting the clock signal to activate a first of the one or more converter groups. With reference to various implementations as described in FIGS. 1-8 and 10, upon receiving the first digital output (e.g., "1") of the first comparison, transmitting the clock signal (e.g., gating clock in FIG. 1, final conversion clock in FIG. 5] to activate a first of the one or more converter groups (e.g., 130, 530).

Figure 10:
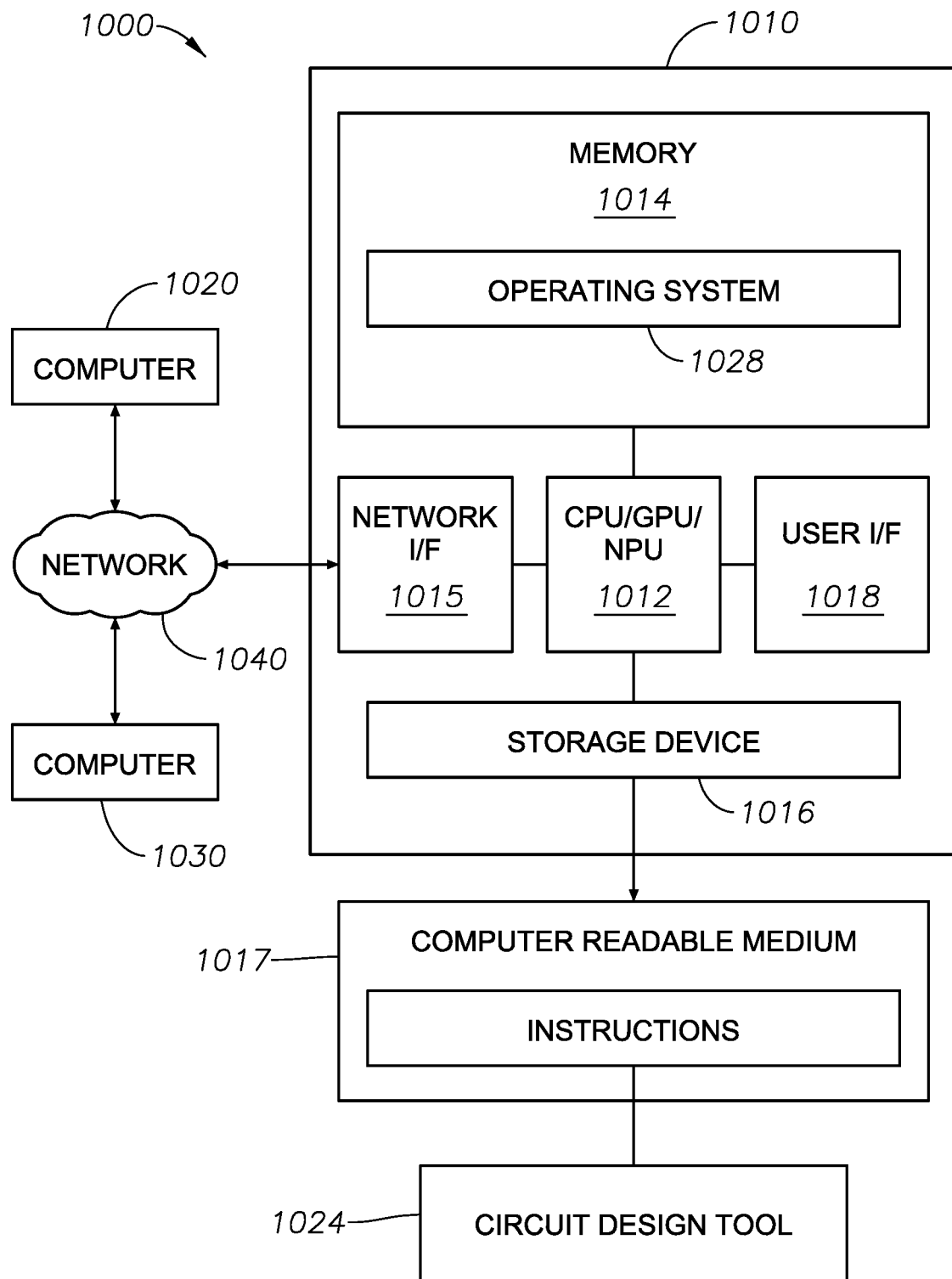
FIG. 10 is a schematic block diagram implementable with example circuits and methods.

FIG. 10 illustrates example hardware components in the computer system 1000 that may be used to generate a clock signal for activation of one or more converters or converter groups is shown. In certain implementations, the example computer system 1000 (e.g., networked computer system and/or server) may include a circuit design tool 1024 (i.e., a design tool) and execute software based on the procedure as described with reference to the description in the operation of FIG. 2 and method 900 in FIG. 9. In certain implementations, the circuit design tool 1024 may be included as a feature of an existing memory compiler software program.

In some cases, the circuit design tool 1024 may provide generated computer-aided physical layout designs for memory architecture. The procedure (as described with reference to FIG. 9) may be stored as program code as instructions 1017 in the computer readable medium of the storage device 1016 (or alternatively, in memory 1014) that may be executed by the computer 1010, or networked computers 1020, 1030, other networked electronic devices (not shown) or a combination thereof. In certain implementations, each of the computers 1010, 1020, 1030 may be any type of computer, computer system, or other programmable electronic device. Further, each of the computers 1010, 1020, 1030 may be implemented using one or more networked computers, e.g., in a cluster or other distributed computing system.

In certain implementations, the system 1000 may be used with semiconductor integrated circuit (IC) designs that contain all standard cells, all blocks or a mixture of standard cells and blocks. In a particular example implementation, the system 1000 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 100 may be stored in one or more of memory 1014 or storage devices 1016 of computer 1010 or in networked computers 1020, 1030.

The system 1000 may perform the following functions automatically, with variable user input: including a power converter; a user-provided reference signal; control elements. In some instances, such functions may be performed substantially via user input control. Additionally, such functions can be used in conjunction with the manual capabilities of the system 1000 to produce the target results that are required by a designer.

In one implementation, the computer 1000 includes a processing unit 1012 having at least one hardware-based processor coupled to a memory 1014. In certain implementations, the processing unit 1012 may include one or more of a central processing unit (CPU), a graphical processing unit (GPU) or a neural processing unit (NPU). The memory 1014 may represent random access memory (RAM) devices of main storage of the computer 1010, supplemental levels of memory (e.g., cache memories, non-volatile or backup memories (e.g., programmable or flash memories)), read-only memories, or combinations thereof. In addition to the memory 1014, the computer system 1000 may include other memory located elsewhere in the computer 1010, such as cache memory in the processing unit 1012, as well as any storage capacity used as a virtual memory (e.g., as stored on a storage device 1016 or on another computer coupled to the computer 1010).

The computer 1010 may further be configured to communicate information externally. To interface with a user or operator (e.g., a circuit design engineer), the computer 1010 may include a user interface (I/F) 1018 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 1010 may include a network interface (I/F) 1015 which may be coupled to one or more networks 1040 (e.g., a wireless network) to enable communication of information with other computers and electronic devices. The computer 1060 may include analog and/or digital interfaces between the processing unit 1012 and each of the components 1014, 1015, 1016, and 1018. Further, other non-limiting hardware environments may be used within the context of example implementations.

The computer 1010 may operate under the control of an operating system 1026 and may execute or otherwise rely upon various computer software applications, components, programs, objects, modules, data structures, etc. (such as the programs associated with the procedure 900 and related software). The operating system 1028 may be stored in the memory 1014. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 1026 in the example of FIG. 10 is shown in the memory 1014, but components of the aforementioned software may also, or in addition, be stored at non-volatile memory (e.g., on storage device 1016 (data storage) and/or the non-volatile memory (not shown). Moreover, various applications, components, programs, objects, modules, etc. may also execute on one or more processors in another computer coupled to the computer 1010 via the network 1040 (e.g., in a distributed or client-server computing environment) where the processing to implement the functions of a computer program may be allocated to multiple computers 1020, 1030 over the network 1040.

In other implementations, advantageously, the need for a computer device would not be required. In such implementations, a comparator and shift register chain would be utilized, but the need for any computer device may be eliminated.

In example implementations, circuit diagrams and representations have been provided in FIGS. 1-10, whose redundant description has not been duplicated in the related description of analogous circuit diagrams and representations. It is expressly incorporated that the same layout diagrams with identical symbols and/or reference numerals are included in each of embodiments based on its corresponding figure(s).

Although one or more of FIGS. 1-10 may illustrate systems, apparatuses, or methods according to the teachings of the disclosure, the disclosure is not limited to these illustrated systems, apparatuses, or methods. One or more functions or components of any of FIGS. 1-10 as illustrated or described herein may be combined with one or more other portions of another of FIGS. 1-10. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 814, the storage device 816, or both, include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A circuit comprising:
   a comparator;
   a shift register chain coupled to the comparator; and
   one or more parallel converters coupled to respective shift registers of the shift register chain, wherein:
      the one or more parallel converters are configured to convert a source of current from a first voltage to a second voltage,
      the circuit is configured to selectively transmit an output signal to the one or more parallel converters, and
      an output of the comparator is configured to enable the shift register chain independent of the one or more parallel converters.

2. The circuit of claim 1, wherein:
   the one or more parallel converters comprise one or more converter groups.

3. The circuit of claim 2, wherein each of the shift registers is configured to selectively transmit the output signal to the one or more parallel converters, wherein the one or more converter groups comprise two or more converter groups, and wherein at least one of the shift registers of the shift register train is coupled to at least respective converters of different converter groups of the two or more converter groups.

4. The circuit of claim 1, wherein the output signal is either a gating clock signal or a conversion clock signal.

5. The circuit of claim 4, wherein the conversion clock signal comprises a single converter clock, one or more synchronized converter clocks, or one or more asynchronous converter clocks.

6. The circuit of claim 1, wherein:
   at least one of the one or more parallel converters comprise multiple converters coupled to a respective shift register of the shift register chain, and
   the circuit is configured to control activation of the one or more parallel converters.

7. The circuit of claim 1, wherein the output of the comparator is coupled directly to the shift register chain.

8. The circuit of claim 1, wherein the one or more parallel converters comprise one or more time-weighted converter groups.

9. A circuit comprising:
   a comparator;
   a shift register chain coupled to the comparator;
   one or more converters coupled to respective shift registers of the shift register chain, wherein the one or more converters are configured to convert a source of current from a first voltage to a second voltage, and wherein the circuit is configured to selectively transmit an output signal to the one or more converters: and
   respective logic gates coupled to each of the shift registers of the shift register chain and the respective one or more converters or converter groups, wherein each of the shift registers are configured to transmit respective output signals to first inputs of the respective logic gates.

10. The circuit of claim 9, wherein second inputs of the respective logic gates are configured to receive a converter clock signal, and wherein each of the respective logic gates output respective conversion clock signals.

11. The circuit of claim 10, wherein the respective one or more converters are activated by the respective conversion clock signals.

12. The circuit of claim 10, further comprising a ring oscillator, wherein the ring oscillator is configured to generate clock signals for a control clock and for a converter clock, wherein the control clock is input to the comparator and shift register chain, and the converter clock is input to respective logic gates.

13. A method comprising:
   performing a first comparison, at a comparator, of a voltage sample to a reference voltage sample, wherein:
      when the voltage sample is above the reference voltage sample, a first digital output is transmitted to a first register of a shift register chain; and
      upon receiving the first digital output of the first comparison, transmitting an output signal to activate a first respective converter of one or more parallel converters, wherein each of the one or more parallel converters are configured to separately convert a source of current from a first voltage to a second voltage, wherein the output of the comparator is configured to enable the shift register chain independent of the one or more parallel converters.

14. The method of claim 13, wherein the one or more parallel converters comprise one or more converter groups.

15. The method of claim 13, wherein when the voltage sample is below the reference voltage sample, a second digital output of the first comparison is transmitted to the first register of the shift register chain, and wherein when the first register of the shift register chain receives the second digital sample, the output signal is not transmitted to the first converter of one or more parallel converters.

16. The method of claim 15, further comprising:
   performing a second comparison, at the comparator, of a second voltage sample to a second reference voltage sample, wherein:

when the second voltage sample is above the second reference voltage sample, the first digital output is transmitted to a first register of a shift register chain; and when the second voltage sample is below the second reference voltage sample, the second digital output is transmitted to the first register of the shift register chain, and wherein upon receiving the first digital output of the second comparison, transmitting the output signal to activate the first converter of the one or more parallel converters.

17. The method of claim 15, further comprising:

at the first register of the shift register chain, upon receiving either the first or the second digital output of a second comparison, shifting, by the first register of the shift register chain, either the first or second digital output of the first comparison to a second register of the shift register chain.

18. The method of claim 17, wherein when the second register of the shift register chain receives the first digital output of the second comparison, transmitting the output signal to activate a second of the one or more parallel converters.

19. A method comprising:

performing a first comparison, at a comparator, of a voltage sample to a reference voltage sample, wherein:

when the voltage sample is above the reference voltage sample, a first digital output is transmitted to a first register of a shift register chain; and upon receiving the first digital output of the first comparison, transmitting an output signal to activate a first converter of one or more converters, wherein the one or more converters are configured to convert a source of current from a first voltage to a second voltage, wherein the output signal is a gating clock signal, and wherein upon receiving the first digital output of the first comparison, transmitting the gating clock signal to a first input of a first logic gate; and further comprising:

transmitting a converter clock signal to a second input of the first logic gate; and outputting, from the first logic gate, a conversion clock signal.

20. A circuit comprising:

a comparator;

a shift register chain coupled to the comparator; and one or more converter groups coupled to respective shift registers of the shift register chain, wherein:

each of respective shift registers is coupled directly between the comparator and a respective converter group of the one or more converter groups, the one or more converter groups are configured to convert a source of current from a first voltage to a second voltage, and the circuit is configured to selectively control modulators for the one or more converter groups.

* * * * *